United States Patent
Jaiswal et al.

(10) Patent No.: US 10,802,827 B2
(45) Date of Patent: Oct. 13, 2020

(54) MEMORY DEVICE HAVING IN-SITU IN-MEMORY STATEFUL VECTOR LOGIC OPERATION

(71) Applicant: Purdue Research Foundation, West Lafayette, IN (US)

(72) Inventors: Akhilesh Ramlaut Jaiswal, West Lafayette, IN (US); Amogh Agrawal, West Lafayette, IN (US); Kaushik Roy, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 16/265,024

(22) Filed: Feb. 1, 2019

(65) Prior Publication Data
US 2019/0258482 A1 Aug. 22, 2019

Related U.S. Application Data

(60) Provisional application No. 62/634,165, filed on Feb. 22, 2018.

(51) Int. Cl.
| | |
|---|---|
| *G11C 11/16* | (2006.01) |
| *G06F 9/30* | (2018.01) |
| *H01L 27/22* | (2006.01) |
| *H01L 43/08* | (2006.01) |
| *H03K 19/18* | (2006.01) |

(52) U.S. Cl.
CPC ........ *G06F 9/3004* (2013.01); *G06F 9/30036* (2013.01); *G11C 11/161* (2013.01); *G11C 11/1659* (2013.01); *G11C 11/1675* (2013.01); *H01L 27/228* (2013.01); *H01L 43/08* (2013.01); *H03K 19/18* (2013.01)

(58) Field of Classification Search
CPC .......................... G11C 11/161; G11C 11/1675
USPC ................................................... 365/158, 171
See application file for complete search history.

(56) References Cited

U.S. PATENT DOCUMENTS 9,654,110 B2 *  5/2017  Johnson ................ G11C 11/161
9,754,997 B2 *  9/2017  Johnson .............. G11C 11/1673

OTHER PUBLICATIONS

Brown Jr, Thermal Fluctuations of a Single-Domain Particle, 1963, Journal of Applied Physics 34, 1319.

(Continued)

*Primary Examiner* — Son L Mai
(74) *Attorney, Agent, or Firm* — Piroozi-IP, LLC

(57) ABSTRACT

An in-situ in-memory implication gate is disclosed. The gate include a memory cell. The cell includes a first voltage source, a second voltage source lower in value than the first voltage source, a first and second magnetic tunneling junction devices (MTJ) selectively juxtaposed in a series and mirror imaged relationship between the first and second sources, each having a pinned layer (PL) in a first direction and a free layer (FL) having a polarity that can be switched from the first direction in which case the MTJ is in a parallel configuration presenting an electrical resistance to current flow below a first resistance threshold to a second direction in which case the MTJ is in an anti-parallel configuration presenting an electrical resistance to current flow higher than a second resistance threshold, and further each having a non-magnetic layer (NML) separating the PL from the FL.

17 Claims, 10 Drawing Sheets

(56) References Cited

OTHER PUBLICATIONS

Kanai et al., Magnetization switching in a CoFeB/MgO magnetic tunnel junction by combining spintransfer torque and electric field-effect, 2014, Applied Physics Letters 104, 212406.
Jain et al., Computing in Memory With Spin-Transfer Torque Magnetic RAM, Mar. 2018, IEEE Transactions on Very Large Scale Integration (VLSI) Systems, vol. 26, No. 3.
Wang et al., Magnetization Characteristic of Ferromagnetic Thin Strip by Measuring Anisotropic Magnetoresistance and Ferromagnetic Resonance, 2014, Solid State Communications 182, 10.
Shannon, A symbolic Analysis of Relay and Switching Circuits, 1938, AIEE Transactions 57, 713.
Bardeen et al., The Transistor, A Semi-Conductor Triode, 1948, Physical Review 74, 230.
Chen et al., Data-intensive applications, challenges, techniques and technologies: A survey on Big Data, 2014, Information Sciences 275,314.
Emma, Understanding some simple processor-performance limits, 1997, IBM journal of Research and Development 41, 215.
Zaharia et al., Resilient Distributed Datasets: A Fault-Tolerant Abstraction for In-Memory Cluster Computing,2012, Proceedings of the 9th USENIX conference on Net-worked Systems Design and Implementation (USENIX Association), pp. 2-2.
Linn et al., Beyond von Neumann—logic operations in passive crossbar arrays alongside memory operations, 2012, Nanotechnology 23, 305205.
Kang et al., An Energy-Efficient VLSI Architecture for Pattern Recognition Via Deep Embedding of Computation in SRAM, 2014, Acoustics, Speech and Signal Processing (ICASSP), IEEE International Conference on(IEEE), pp. 8326-8330.
Roy et al. Leakage Current Mechanisms and Leakage Reduction Techniques in Deep-Submicrometer CMOS circuits, 2003, Proceedings of the IEEE 91, 305.
Ghani et al., Scaling Challenges and Device Design Requirements for High Performance Sub-50 nm Gate Length Planar CMOS Transistors, 2000, VLSI Technology, Digest of Technical Papers. 2000 Symposium on (IEEE), pp. 174-175.
Skotnicki et al., Toward the Introduction of New Materials and Structural Changes to Improve MOSFET Performance, 2005, IEEE Circuits and Devices Magazine 21, 16.
Huai, Spin-Transfer Torque MRAM (STT-MRAM): Challenges and Prospects, 2008, AAPPS bulletin 18, 33.
Lin et al., 45nm Low Power CMOS Logic Compatible Embedded STT MRAM Utilizing a Reverse-Connection 1T/1MTJ Cell, 2009, Electron De-vices Meeting (IEDM), IEEE International (IEEE), pp. 1-4.
Govoreanu et al., 10×10nm2 Hf/HfOx Crossbar Resistive RAM with Excellent Performance, Reliability and Low-Energy Operation, 2011, Electron Devices Meeting (IEDM), IEEE International (IEEE) pp. 31-6.
Wong et al., Phase Change Memory, 2010, Proceedings of the IEEE 98, 2201.
Nomura et al., Modulation of domain wall dynamics in TbFeCo single layer nanowire, 2012, Journal of Applied Physics 111, 07E330.
Noguchi et al., A 250-MHz 256b-I/O 1-Mb STT-MRAM with Advanced Perpendicular MTJ based Dual Cell for Nonvolatile Magnetic Caches to Reduce Active Power of Processors, 2013, VLSI Technology (VLSIT), Symposium on (IEEE), pp. C108-C109.
Borghetti et al., 'Memristive' switches enable 'stateful' logic operations via material implication, 2010, Nature 464, 873.
Zhang et al., Stateful Reconfigurable Logic via a Single-Voltage-Gated Spin Hall-Effect Driven Magnetic Tunnel Junction in a Spintronic Memory, 2017, IEEE Transactions on Electron Devices 64, 4295.
Mahmoudi et al., High Performance MRAM-Based Stateful Logic, 2014, Ultimate Integration on Silicon (ULIS), 15th International Conference on (IEEE), pp. 117-120.
Stiles et al., Anatomy of spin-transfer torque, 2002, Physical Review B 66,014407.
Jaiswal et al., Comprehensive Scaling Analysis of Current Induced Switching in Magnetic Memories Based on In-Plane and Perpendicular Anisotropies, 2016, IEEE Journal on Emerging and Selected Topics in Circuits and Systems 6, 120.
Alzate et al., Voltage-Induced Switching of Nanoscale Magnetic Tunnel Junctions, 2012, Electron Devices Meeting (IEDM), IEEE International (IEEE), pp. 29-5
Borisov et al., Magnetoelectric Switching of Exchange Bias, 2005, Physical Review Letters 94, 117203.
Amiri et al., Voltage-Controlled Magnetic Anisotropy in Spintronic Devices, 2012, Spin (World Scientific), vol. 2, p. 1240002.
Zhang et al., Model of orbital population for voltage-controlled magnetic anisotropy in transition-metal thin films, 2017, Physical Review B 96, 014435.
Kyuno et al., First Principal Calculation of the Magnetic Anistotropy Energies of Ag/Fe(001) and Au/Fe(001) Multilayers, 1996, Journal of the Physical Society of Japan 65, 1334.
Sharmin et al., Modeling and Design Space Exploration for Bit-Cells Based on Voltage-Assisted Switching of Magnetic Tunnel Junctions, 2016, IEEE Transactions on Electron Devices 63, 3493.
Chen, Field-free spin-orbit torque switching of composite perpendicular CoFeB/Gd/CoFeB layers utilized for three-terminal magnetic tunnel junctions, 2017, Applied Physics Letters 111, 012402.
Wang et al., Comparative Evaluation of Spin-Transfer-Torque and Magnetoelectric Random Access Memory, 2016, IEEE Journal on Emerging and Selected Topics in Circuits and Systems 6, 134.
Gilbert et al., A Phenomenological Theory of Damping in Ferromagnetic Materials, 2004, IEEE Transactions on Magnetics 40, 3443.
D'Aquino et al., Nonlinear Magnetization Dynamics in Thin-films and Nanoparticles, 2005, Ph.D. thesis, University degli Studi diNapoli Federico II.
Ikeda et al., A perpendicular-anisotropy CoFeB—MgO magnetic tunnel junction, 2010, Nature materials 9, 721.
Noguchi et al., Novel Voltage Controlled MRAM (VCM) with Fast Read/Write Circuits for Ultra Large Last Level Cache, 2016, Electron De-vices Meeting (IEDM), IEEE International (IEEE), pp. 27-5.
Wang et al., KNACK: A Hybrid Spin-Charge Mixed-Mode Simulator for Evaluating Different Genres of Spin-Transfer Torque MRAM Bit-cells, 2014, Solid State Communications 182, 10.

* cited by examiner

MEMORY DEVICE HAVING IN-SITU IN-MEMORY STATEFUL VECTOR LOGIC OPERATION

CROSS-REFERENCE TO RELATED APPLICATIONS

The present patent application is related to and claims the priority benefit of U.S. Provisional Patent Application Ser. No. 62/634,165 filed Feb. 22, 2018, the contents of which is hereby incorporated by reference in its entirety into the present disclosure.

STATEMENT REGARDING GOVERNMENT FUNDING

This invention was made with government support under CCF-1320808 awarded by the National Science Foundation. The government has certain rights in the invention.

TECHNICAL FIELD

The present disclosure generally relates to electronic memory, and in particular, to memories capable of in-situ stateful memory operations.

BACKGROUND

This section introduces aspects that may help facilitate a better understanding of the disclosure. Accordingly, these statements are to be read in this light and are not to be understood as admissions about what is or is not prior art.

Traditionally, a computer's architecture has included (i) a processor, (ii) memory, and (iii) other peripheral components. This architecture is often referred to as the von-Neumann architecture, after its inventor. This architecture is based on decoupling the memory from the processor, and is found in millions of computers worldwide. A schematic of this architecture 1 is shown in FIG. 1, where a memory 2 is decoupled from the processor 4, and where the memory 2 and the processor 4 communicate via data exchange bus 6. While there has been an explosion of computing powers using this architecture, it is now failing to answer the call of data exchange in such applications as big-data, artificial intelligence, Internet-of-things (IoT), and other data intensive operations. The shortcoming of this architecture is mainly due to a bottleneck 8 found between the memory 2 and the processor 4. This bottleneck 8 mainly arises from a limited data transfer rate between these two physically decoupled units, There are two major challenges with this bottleneck: (1) cycle time needed for data transfer (i.e., throughput), and (2) energy consumption associated with data transfer, To combat these two drawbacks associated with the bottleneck 8, one approach investigated in the prior art is to utilize in-memory vector computations. In such cases, not only does the decoupled memory maintain data it also provides rudimentary logic operations. In certain cases wherein the memory elements constituting the memory unit 2 act both as memory storage primitive and also vector in-memory primitives they are termed as stateful memory primitives. These in-memory operations, thus, remove some of the issues associated with the bottleneck 8 as (1) data transfer between the memory 2 and the processor 4 is reduced, and (2) consequently energy consumption is also reduced.

Exemplary stateful in-memory technologies are based on spin based magnetic random access memories (MRAMs), resistive RAMs, and phase change materials based memories. These technologies are under investigation for not only replacement of silicon-based devices but also changing or improving the von-Neumann architecture. As a requirement for retaining the data even during power-down cycles, one key desirable characteristic for memory elements is non-volatility. In particular, low leakage applications, non-volatility is a desirable requirement for memory storage.

However, each of these technologies have their own associated limitations. For example, prior-art in-memory computing using STT-MRAM, included placement of modified read circuits within the memory array to directly read a bitwise Boolean logic data by activating multiple rows. In general, such multi-row activation, especially with STT-MRAMs suffer from poor sense-margin. In addition, where multiple cascaded Boolean operations are needed, such prior-arts would require a memory read operation for each bit-wise Boolean operation leading to lower throughput and higher energy consumption Mem-resistive devices, known to a person having ordinary skill in the art, present another set of devices that provide in-situ and in-memory operations resulting in stateful devices. However, this technology presents challenges from efficiency perspective and suffers from limited life-cycle and material endurance.

Therefore, there is an unmet need for a novel in-situ-in-memory approach that provides high throughput, improved energy efficiency and parallelism, and better non-volatility and endurance than existing technologies.

SUMMARY

An in-situ in-memory implication gate is disclosed. The gate include a memory cell. The cell includes a first voltage source, a second voltage source lower in value than the first voltage source, a first and second magnetic tunneling junction devices (MTJ) selectively juxtaposed in a series and mirror imaged relationship between the first and second sources, each having a first magnetic layer with a fixed a polarity (pinned layer (PL)) in a first direction and a second magnetic layer (free layer (FL)) having a polarity that can be switched from the first direction in which case the MTJ is in a parallel (P) configuration presenting an electrical resistance to current flow below a first resistance threshold to a second direction in which case the MTJ is in an anti-parallel (AP) configuration presenting an electrical resistance to current flow higher than a second resistance threshold, and further each having a non-magnetic layer (NML) separating the PL from the FL. Each of the first and second MTJs presents an energy barrier (EB) to switching from P to AP or AP to P based on voltage across PL and FL ($V_{PLFL}$) such that when $V_{PLFL}$ is less than zero, the corresponding MTJ's EB is higher than a predetermined EB threshold corresponding to $V_{PLFL}$ equal to zero, and when $V_{PLFL}$ is greater than zero, the MTJ's EB is lower than the predetermined EB threshold. When the first and second MTJs are in the P-P orientations, the second MTJ flips to AP, and when the first and second MTJs are in P-AP, AP-P, AP-AP, the state of MTJs remains unchanged.

An in-situ in-memory logic gate is also disclosed. The gate includes a memory cell. The cell includes a first voltage source, a second voltage source lower in value than the first voltage source, a first magnetic tunneling junction device (MTJ) selectively disposed between the first and second sources, the MTJ having a first magnetic layer with a fixed a magnetic polarity (pinned layer (PL)) in a first direction and a second magnetic layer (free layer (FL)) having a magnetic polarity that can be switched from the first direction in which case the MTJ is in a parallel (P) configuration presenting an electrical resistance to current flow below a first resistance threshold to a second direction in which case the MTJ is in an anti-parallel (AP) configuration presenting an electrical resistance to current flow higher than a second resistance threshold, and further the MTJ having a non-magnetic layer (NML) separating the PL from the FL. When a positive voltage across PL and FL ($V_{PLFL}$) is applied for a predetermined duration of time to the MTJ, the magnetic polarity of the FL precesses between the first and second directions thereby switching the MTJ between P and AP states between the first and second directions thereby switching the MTJ between P and AP states.

DETAILED DESCRIPTION

Figure 1:
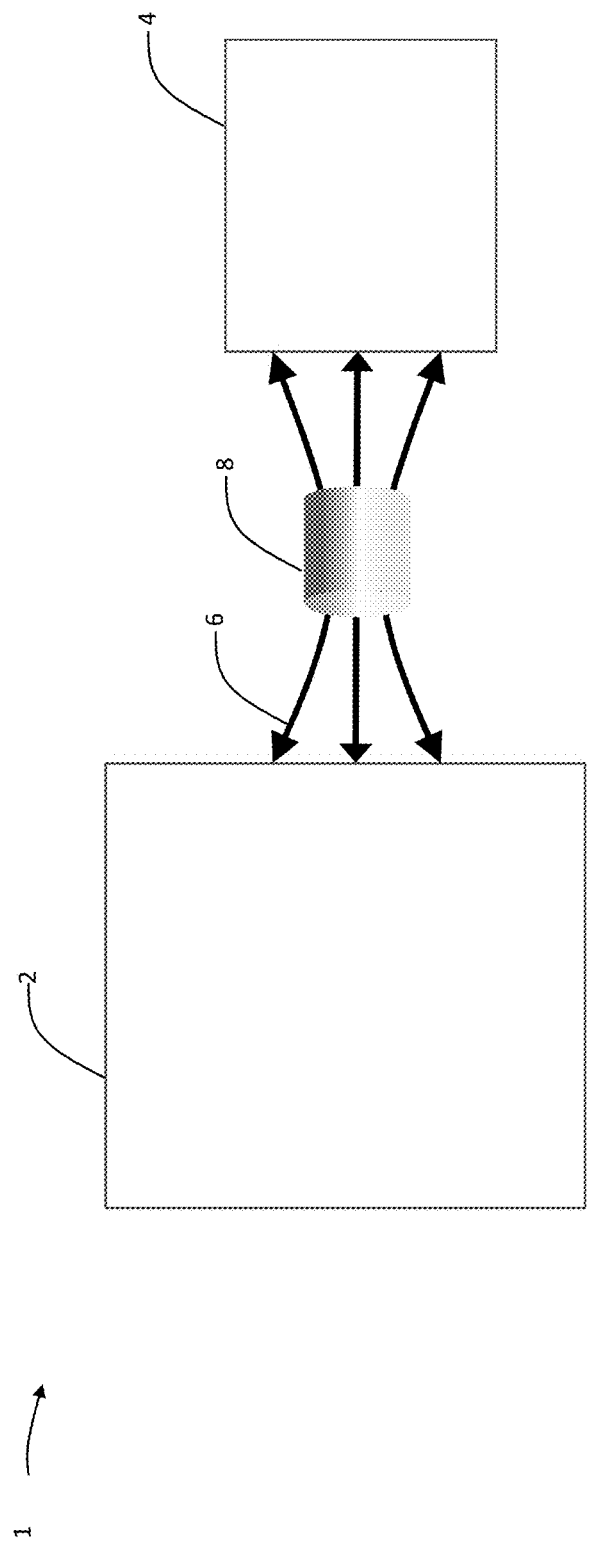
FIG. 1 is a schematic of a computing architecture according to the prior art.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

A novel in-situ-in-memory approach that provides high throughput, improved energy efficiency, and better non-volatility than existing technologies is provided in the present disclosure. This novel approach includes utilization of two terminal magnetic tunnel junction (MTJ) devices and the advantageous and novel use of voltage controlled magnetic anisotropy (VCMA) effect, and particularly the voltage asymmetry of the VCMA, as well as the precessional dynamics of the VCMA switching process. The former is shown in implementation of an in-memory implication (IMP) logic operation and the latter is used to generate a large-scale NOT operation. With these elemental logic device, other logical operations, such as NAND, OR, NIMP, and massively parallel XOR are also presented.

Prior to delving into the particular aspects of the novel in-memory architecture, according to the present disclosure, some basic information is first presented. As an initial matter, the MTJ is first described.

Figure 2:
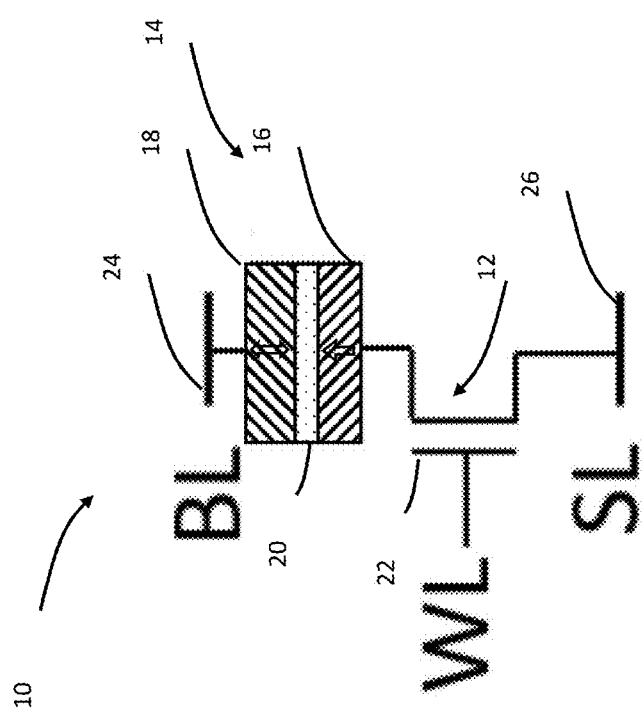
FIG. 2 is a schematic of a typical spin-torque transfer magnetic read access memory (STT-MRAM) bit cell.

Referring to FIG. 2 a typical spin-torque transfer magnetic read access memory (STT-MRAM) bit cell 10 is shown. The STT-MRAM bit cell 10 includes an access transistor 12 and a magnetic tunnel junction (MTJ) stack 14. The MTJ Stack 14 is positioned between a high side bit line (BL) node 24 and the access transistor 12 and includes a ferromagnetic pinned layer 16 (which has a fixed magnetic orientation) and a free layer 18 (whose orientation can be switched), separated by a tunneling oxide barrier 20. The access transistor is positioned between the MTJ stack 14 and a source line (SL) node 26 and is controlled by a gate 22. The logic state stored in the bit cell depends on the relative orientation between the free layer 18 and the pinned layer 16. According to one embodiment, parallel orientation (i.e., both layers having the same orientation) represents "0" and antiparallel orientation represents "1". Two operations are of importance: a read operation and a write operation. A read operation involves activating the gate 22 of the access transistor 12 identified as a word line (WL) node and applying a bias voltage (Vread) between the BL node 24 and the SL node 26. The resulting read current through the STT-MRAM bit cell 10 is thus compared against a global reference current to determine the logic state stored. A write operation is performed by passing a current greater than a critical switching current ($I_c$) of the MTJ stack 14 (critical current is the current that can cause the free layer to switch from one orientation to another) for a minimum switching duration. The current direction to write a "1" vs. a "0" differs based on the logic value to be written into the STT-MRAM bit cell 10. A read operation requires a small current (i.e., much smaller than the critical switching current) to be passed through the STT-MRAM bit cell 10. This read operation can be accomplished based on a voltage-based sensing scheme wherein a small known current is applied to the BL node 24 and resistance across the STT-MRAM bit cell 10 is measured. A higher resistance (e.g., between about 30 kohms and about 45 kohms) represents a "1"—representing antiparallel orientation—while a lower resistance (e.g., between about 10 kohms and about 15 kohms) represents a "0"—representing parallel orientation—where resistance is measured by comparing the voltage across the STT-MRAM bit cell 10 against a reference voltage Vref (a voltage lower than the voltage associated with the high resistance and higher than the voltage associated with the low resistance); or based on a current-based sensing wherein a small voltage is applied across the STT-MRAM bit cell 10 and the current through the STT-MRAM bit cell 10 is measured, where a large current represents a "0", representing a parallel orientation, and small current represents a "1".

As described above two approaches for switching MTJs are disclosed herein. The first is based on VCMA-STT switching (here switching is referred to switching between parallel and anti-parallel and vice versa, as discussed above), in which advantageously the energy barrier (EB) is lowered thereby lowering the current requirement for write operation. The second approach is based on VCMA-precessional switching in which current requirement for switching in principle can be removed all-together. In the VCMA-precessional switching, the MTJ is subjected to a voltage of a certain polarity and for appropriate amount of time to allow reversal of the magnetic polarization of the nanomagnet about a hard axis to thereby switch the MTJ. Each of these approaches are further discussed below in detail.

Figure 3B:
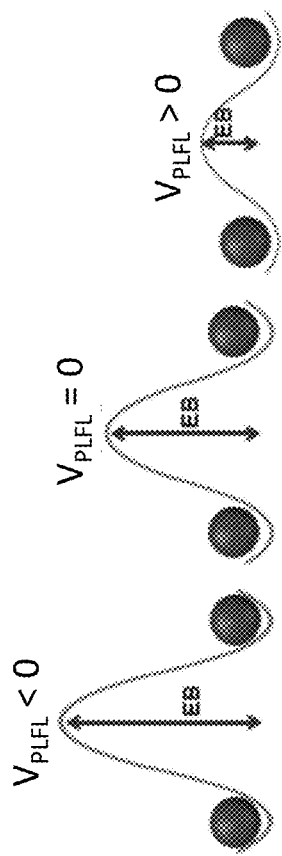
FIG. 3B is a graph of a voltage controlled magnetic anisotropy (VCMA) effect acting on the MTJ stack of FIG. 3A and the associated-voltage asymmetry.
Figure 3A:
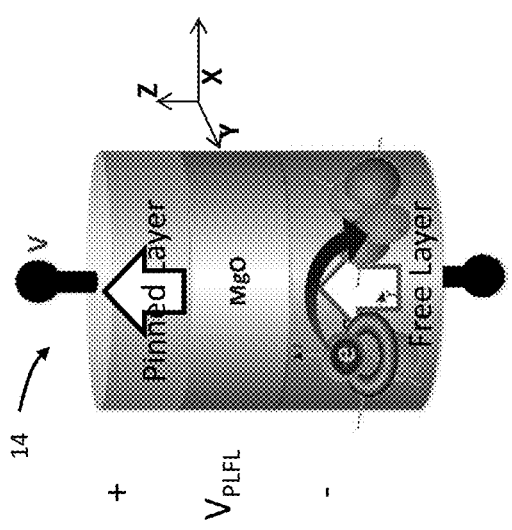
FIG. 3A is a schematic of a magnetic tunnel junction (MTJ) stack.

VCMA-STT based switching is now described. FIG. 3A represents a schematic of the MTJ stack 14. Traditionally, the state of the MTJ is switched from parallel orientation to anti-parallel (and vice versa) by the STT effect. For a typical STT-based switching, a spin polarized current passing through the FL exerts a torque on the FL thereby flipping the state of the MTJ from the P to the AP state, and vice versa based on the direction of current. However, this current can be large. It is the interface anisotropy that creates the required EB between the two stable states of the MTJ. The EB is proportional to the current: the higher the EB, the higher the current requirement. To alleviate this situation, according to the present disclosure, VCMA effect can be used to cause switching of the MTJs. That is in the VCMA-STT approach, voltage asymmetry changes the interface anisotropy in order to reduce the current requirement when a particular polarity of voltage is applied across the MTJ. A major difference in MTJs that are switched based on VCMA effect is that the tunnel barrier layer (i.e., the oxide layer) is much thicker than in the STT-dominant switching regime and also the free layer magnet is thinner as compared to STT-dominated switching regime. As such, in the STT-dominant switching regime with its typical oxide thickness, the current requirement (i.e., current greater than a critical current to switch the MTJ) that passes through the MTJ does not affect the energy barrier of the MTJ. In contrast, in the VCMA-STT dominant switching regime with its thicker oxide thickness (e.g., between about 1.3 nm and about 1.5 nm) and thinner free layer (e.g., between about 0.7 nm and about 1.2 nm) application of an electric field affects the energy barrier of the MTJ.

With reference to FIG. 3A, to better understand the write operation, let us identify the voltage across the MTJ stack 14 as $V_{PLFL}$, for the voltage across the pinned layer and the free layer as oriented in FIG. 3A. As discussed above, a spin polarized current passing through the FL exerts a torque on the FL thereby flipping the state of the MTJ from the P to the AP state. However, the exerted torque by the STT mechanism (the traditional approach for flipping a MTJ) has to be sufficient to overcome an EB associated with the FL that maintains the FL in a given state. The EB is the result of the interface anisotropy that creates the required energy barrier between the two stable states of the MTJ. As discussed above, in general, EB and the required current to switch the FL are proportional (i.e., the higher the EB, higher is the current required to switch the MTJ). However, this proportionality (i.e., a high current for a high EB) can generate a challenge with a high switching current requirement. The VCMA effect and the associated-voltage asymmetry effect is shown in FIG. 3B.

By applying an electric field one can modulate the relative occupancy of the valence d-orbitals, as shown schematically in FIG. 3A. As a result, as mentioned above the interface anisotropy is effectively changed. For the MTJ stack 14 it is this interface anisotropy that is primarily responsible for creating the required EB. It should be appreciated that a large EB is required for maintaining the non-volatility of the MTJ devices. However, a large EB also makes it more difficult to switch the nano-magnets during the write process. The VCMA effect allows a temporarily reduction of the EB by reducing the interface anisotropy in response to application of an electric field. The reduced EB makes it easier to switch the nano-magnets, thereby reducing the switching current requirement. On the other hand, if the direction of the electric field is reversed, EB increases due to the VCMA effect making it much more difficult to switch the nano-magnet. As shown in FIG. 3B, the VCMA effect makes the MTJ stack asymmetric with respect to the voltage polarity. With favorable voltage polarity (pinned layer at higher potential than the free layer, i.e., $V_{PLFL}>0$, or as shown in the far right waveform of FIG. 3B) the MTJ can be easily switched, representing an EB less than an EB threshold associated with $V_{PLFL}=0$, of about 60 KT, where K is the Boltzmann constant and T is temperature, while if the voltage polarity is reversed the MTJ would be difficult to switch (i.e., pinned layer at lower potential than the free layer, i.e., $V_{PLFL}<0$, or as shown in the far left waveform of FIG. 3B), representing an EB greater than the EB threshold.

It should be appreciated that irrespective of magnetic orientation (i.e., parallel or anti-parallel) when $V_{PLFL}>0$, the EB is decreased resulting in easier switching; and when $V_{PLFL}<0$, the EB is increased, resulting in much harder switching. However, the VCMA effect described herein is asymmetric. That is, when the MTJ stack 14 is in the parallel orientation, the VCMA phenomenon allows switching from a parallel to an anti-parallel by first reducing EB (thereby reducing the critical current needed to switch) and then passing a small current larger than the now-reduced critical current to switch the MTJ stack 14 from the parallel to the anti-parallel orientation. However, the same does not hold for switching from the anti-parallel to the parallel orientation. Because of this asymmetry, the prior art has not used the VCMA phenomenon to switch MTJs based on the STT approach. However, as will be discussed below, when dealing with the implication logic, one needs to only switch in the same asymmetric manner, thereby making use of this phenomenon for the implication logic is advantageous and against the prevailing disfavor of the use of VCMA-STT switching.

With the VCMA-STT switching mechanism of the MTJ stack described, now the first logical operation which is primarily based on the VCMA-STT switching is described. The logical operation is implication. Implication refers to a logical relationship between two vectors (i.e., A(IMP)B), where if A is true, then B has to be true. Therefore, the output of A(IMP)B is true when A is true and B is true, however, the output is false when A is true and B is not true. When A is not true, B can be any value (T/F). Therefore, when A is not true, the output of A(IMP)B is always True. This relationship is shown in Table 1 below, where T represents true or 1 and F represents false or 0.

TABLE 1

| A (IMP) B - Logical values | | |
|---|---|---|
| A | B | A(IMP)B |
| F (0) | F (0) | T (1) |
| F (0) | T (1) | T (1) |
| T (1) | F (0) | F (0) |
| T (1) | T (1) | T (1) |

By corresponding 0 to P and 1 to AP, Table 1 can be rewritten as shown in Table 2.

TABLE 2

| A (IMP) B - Parallel and Antiparallel values | | | |
|---|---|---|---|
| Row | A | B | A(IMP)B |
| 1 | P | P | AP |
| 2 | P | AP | AP |
| 3 | AP | P | P |
| 4 | AP | AP | AP |

Figure 4:
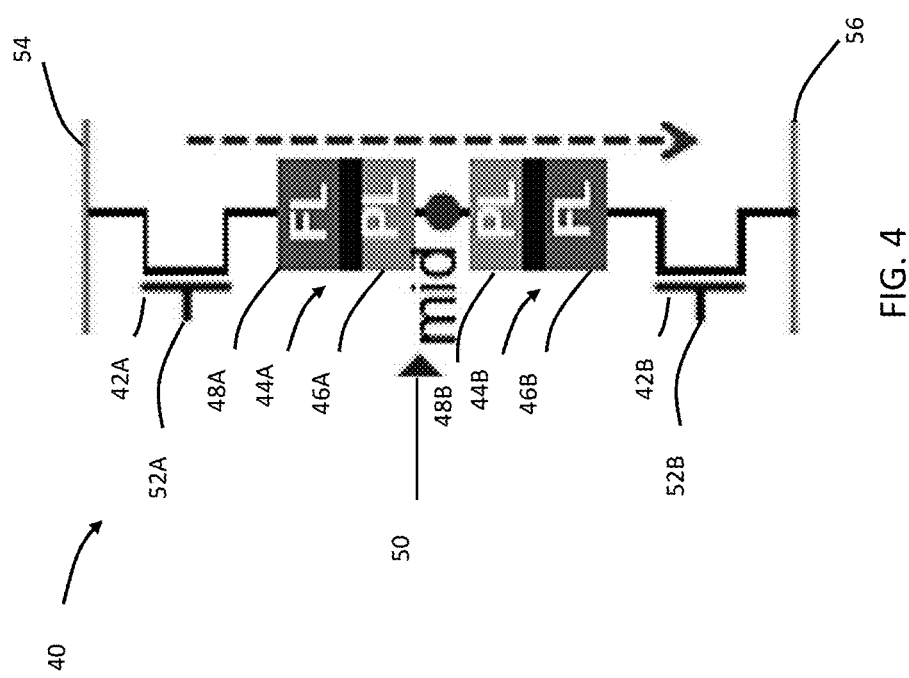
FIG. 4 is a schematic of two MTJ stacks provided in a series combination.

Interestingly, with the exception of the first row, the output of A(IMP)B is the same as B. To demonstrate the switching operation of a two-input implication operation, reference is now made to FIG. 4. The switching scheme 40 includes two switching devices 42A (high side, configured to couple terminal 54 to the MTJ devices 44A and 44B) and 42B (low side, configured to couple the two MTJ devices 44A and 44B to terminal 56), the two MTJ devices 44A and 44B meeting at a midpoint 50, with the FL 48A of the first MTJ 44A coupled to the first switching device 42A as shown in FIG. 4 and the PL 46A of the first MTJ 44A coupled to the midpoint 50; and with the PL 48B of the second MTJ 44B coupled to the midpoint 50, and FL 46B of the second MTJ 44B coupled to the second switching device 42B, as shown in FIG. 4. The first switching device 42A is controlled by a first control line 52A and the second switching device 42B is controlled by a second control line 52B. As shown later (in FIG. 5), the control lines are word lines (WL) and each MTJ 44A and 44B constituting members of a separate row of memory elements.

Prior to describing MTJ switching with respect to FIG. 4, it should also be pointed out that parallel orientation of an MTJ causes the device to have less resistance than the anti-parallel orientation. In other words, when the magnetization of the two nano-magnets is in the same direction (P), the MTJ is in low resistance P state and vice-versa (i.e., when the magnetization of the two nano-magnet is in the opposite direction (AP), the MTJ is in high resistance AP state). With the MTJs 44A and 44B disposed as shown in FIG. 4, and with the terminal 54 at VDD and the terminal 56 at ground, we now refer back to Table 2. Suppose, MTJ 44A is A in Table 2 and MTJ 44B is B and the output of A(IMP)B is the new value of MTJ 44B. It should be noted that for MTJ 44A $V_{PLFL}$<0, and thus in the parallel orientation (see lines 1 and 2 of Table 2), its EB increases (as discussed above). Therefore, if the MTJ 44A has a parallel orientation, it remains in that orientation. However, the MTJ 44B is disposed such that its $V_{PLFL}$>0. As such, with MTJ 44B in the parallel orientation a small amount of current can switch it from parallel to antiparallel orientation, since its EB is decreased. This switching is consistent with row 1 of Table 2. By appropriate choice of VDD and the MTJ resistances, the circuit in FIG. 4 can be designed such that MTJ-44B switches from the P to the AP state only when MTJ 44A is in the P state. A higher voltage at the midpoint 50 (corresponding to the P state of MTJ 44A) would imply enhanced lowering of the EB for MTJ 44B allowing the small current flowing through the MTJ 44B to be able to deterministically switch the MTJ 44B from the P to the AP state as desired. It should be noted that the P to AP switching of the MTJ 44B occurs only when MTJ 44A is in the P state. When MTJ 44A is in the AP state (i.e., high resistance), voltage at the midpoint 50 is not high enough to sufficiently lower the EB of MTJ 44B to cause it to switch under STT switching and thereby MTJ 44B retains its original state (as seen in corresponding to row 3 of Table 2).

The only remaining rows in Table 2 are row 2 and 4. Here, MTJ 44A is in the parallel orientation and MTJ 44B is in the anti-parallel orientation. The current flow direction is such that it always tries to switch MTJ 44B to the AP state. Thus, the state of MTJ 44B is retained for both rows 2 and 4 of Table 2. Thus, by utilizing the circuit shown in FIG. 4, one can implement an implication logic as shown in Table 2. For example, suppose the MTJs 44A and 44B provide electrical resistances in the amounts of 10 kilo-ohms to 30 kilo-ohms for parallel and anti-parallel configurations, respectively. Next suppose terminal 54 is at VDD set in the range 1.5V-2 V, and terminal 56 is at ground. The current through MTJs when both are in parallel (i.e., for MTJ 44A both PL and FL orientations point down while for MTJ 44B both PL and FL orientations point up) is then I1=VDD/(R1+R1) (neglecting presence of series access transistors); where R1 can be considered to be in the range of about 10 kohms. The voltage across MTJ 44B in this situation is thus the current times the resistance (i.e., VDD/(2R1)·R1=VDD/2). This means its $V_{PLFL}$=VDD/2. Similarly, the voltage across MTJ 44A in this configuration is thus the current times the resistance (i.e., VDD/(2R1)·R1=VDD/2). This means its $V_{PLFL}$=−VDD/2. In this configuration, with the lowered EB of MTJ 44B due to a positive voltage being applied across it, the current (i.e., VDD/2R1) is sufficient to flip the MTJ 44B to antiparallel with resistance R2>>R1 (i.e., orientations of PL and FL is such that PL of MTJ 44B points up but its FL points down). It should be appreciated that R1 represents a small resistance. At the same time, since $V_{PLFL}$ of MTJ 44A is less than 0, its EB is increased and MTJ 44A remains in the parallel orientation. This flipping of MTJ 44B from parallel to antiparallel represents row 1 of Table 3. In this configuration (i.e., MTJ 44B in antiparallel and MTJ 44A in parallel orientations), the current through these MTJs is now I2=VDD/(R1+R2), and the voltage across MTJ 44B is now I2·R2. In this arrangement, since the current points down in the same orientation as FL of MTJ 44B, the current increases its EB causing it to remain in the antiparallel orientation. Again, since $V_{PLFL}$ of MTJ 44A is less than 0, its EB is increased and MTJ 44A remains in the parallel orientation. Thus, the states of MTJs remain the same, representing row 2 of Table 3. Now suppose, MTJs 44A and 44B are in the antiparallel and parallel orientations, respectively (i.e., for MTJ 44A FL points up and PL points down, and for MTJ 44B both PL and FL point up). In this arrangement, the current is again I2. For MTJ 44A since EB is increased (its $V_{PLFL}$ is less than zero), it remains in the antiparallel orientation. However, MTJ 44B at first inspection will tend to switch from parallel to antiparallel (similar to the first case related to row 1 of Table 3). However, in this case, I2<<I2, thus the current is insufficient to switch MTJ 44B even though its EB is decreased (its $V_{PLFL}$>0). Finally for the case where both MTJs 44A and 44B are in the antiparallel orientations, (i.e., FL of 44A points up and FL of 44B points down), the states of the MTJs remain since MTJ 44A cannot switch due to increase in EB ($V_{PLFL}$<0). Current tries to switch MTJ 44B to AP, however, MTJ 44B is already in the AP state. Hence, the flow of current only helps strengthening the AP state of the MTJ 44B.

Figure 5:
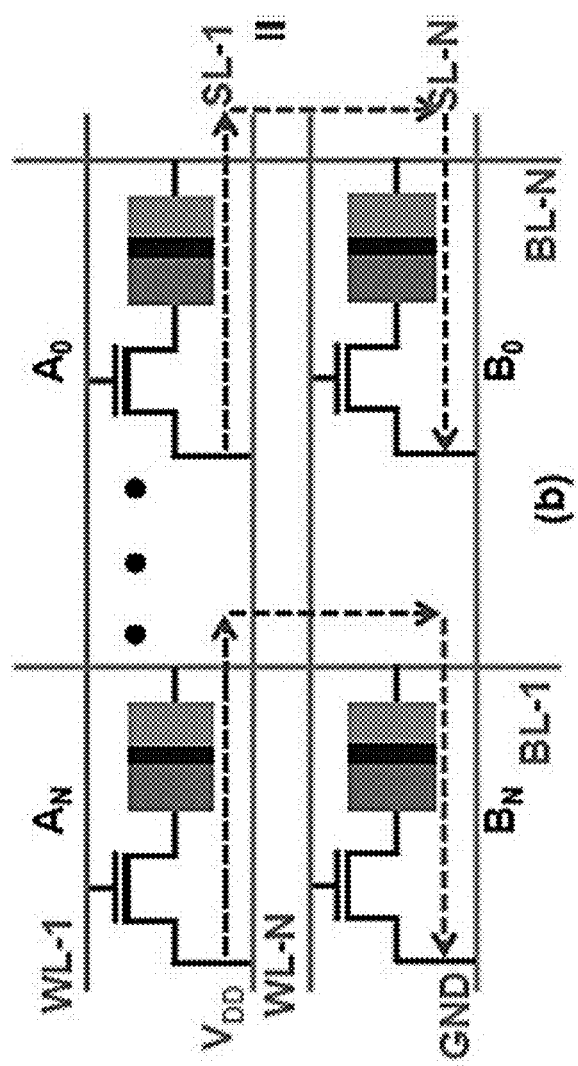
FIG. 5 is a schematic of the two MTJ stack of FIG. 4 provided in a memory architecture.

It should be appreciated that two conditions are relevant in the switching of the MTJs 44A and 44B. The first condition is whether the EB is low or high (see FIGS. 3A-3B), depending on whether a positive or negative voltage is applied to the MTJ. The second condition is whether there is sufficient current flowing through the MTJs 44A and 44B to cause the switching. With the basic two-MTJ circuit described, we now turn to a circuit that can be used in a memory architecture. Referring to the circuit of FIG. 5 and the operation of the MTJs described above, the two-MTJ circuit shown in FIG. 4 is now implemented in a memory architecture in which the control lines 52A and 52B are now coupled to word lines WL-1 and WL-N. Suppose there are two vector input operands 'A' and 'B'. The bits 'A0' to 'AN' which are corresponding to the input 'A' are stored in upper row of the memory array. Similarly, bits 'B0' to 'BN' which are corresponding to the input 'B' are stored in the lower row of the memory array. The circuit shown in FIG. 5 shows a novel arrangement that can provide an exemplary in-situ IMP logic operation. In order to perform the bit-wise IMP computations for operands 'A' and 'B', the corresponding word-lines WL-1 and WL-N are activated. Simultaneously, a voltage VDD would be applied to SL-1, while SL-N would be grounded resulting in a current flow as marked in FIG. 5 in the dashed lines. As such, by merely activating WL-1 and WL-N and applying appropriate voltages on lines SLs (i.e., SL-1 is set to VDD and SL-N is set to ground), in-situ stateful vector IMP operation can be achieved relying on the VCMA effect which thereby selectively lowers the EB for the MTJ 44B based on its asymmetric voltage polarity. Table 3 lists conditions for the MTJs 44A and 44B and their corresponding switching.

TABLE 3

MTJ switching

| Row | Desired New B | $V_{PLFL}$ for MTJ 44A/$V_{PLFL}$ for MTJ 44B | EB for MTJ 44A/EB for MTJ 44B | Comments |
|---|---|---|---|---|
| 1: (A = P, B = P) | AP | Less than 0/ Greater than 0 | Increases/ Decreases | Comment No. 1 |
| 2: (A = P, B = AP) | AP | Less than 0/ Greater than 0 | Increases/ Decreases | Comment No. 2 |
| 3: (A = AP, B = P) | P | Less than 0/ Greater than 0 | Increases/ Decreases | Comment No. 3 |
| 4: (A = AP, B = AP) | AP | Less than 0/ Greater than 0 | Increases/ Decreases | Comment No. 4 |

Comment No. 1: EB for MTJ 44B decreases since $V_{PLFL}$ is greater than 0 and Current through the MTJs is large since both MTJs are in P state (i.e., low resistance), hence MTJ-2 switches to AP. (MTJ-1 cannot switch since $V_{PLFL}$ is less than 0 and thus its EB increases).
Comments No. 2: MTJ 44A cannot switch due to increase in EB. Current tries to switch MTJ 44B to AP, however, MTJ 44B is already in AP state. Hence, the flow of current only helps strengthening the AP state of the MTJ by increasing its EB.
Comment No. 3: EB for MTJ 44B decreases, however current through the MTJs is small since current through MTJ 44A is low since it is in AP state (high-resistance). Hence MTJ 44B even though with lower EB does not have enough current to switch it from P to AP. As such, MTJ 44B retains its P state.
Comment No. 4: MTJ 44A cannot switch due to increase in EB. Current tries to switch MTJ 44B to AP, however, MTJ 44B is already in the AP state. Hence, the flow of current only helps strengthening the AP state of the MTJ 44B.

The in-situ IMP logic described above and shown in FIG. 5 can be used as an elemental logic operation in connection with other operations as will be described further below.

Figure 6A:
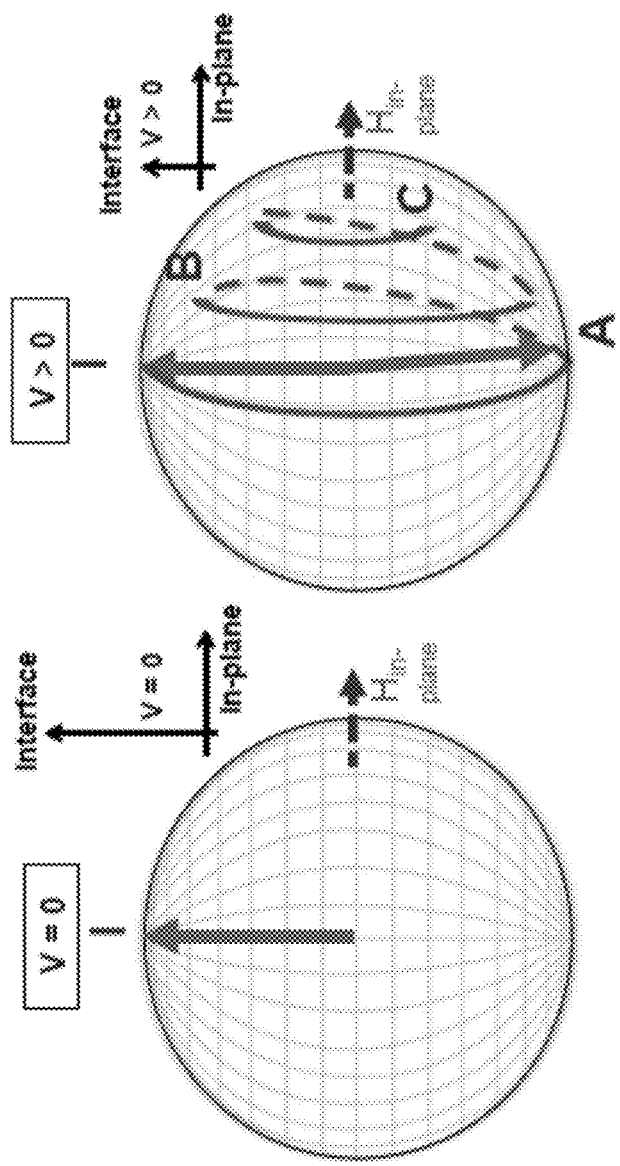
FIG. 6A is a schematic of how the magnetization of an MTJ stack precesses around an in-plane axis when a sufficient positive voltage is applied to lower an associated interface anisotropy.

As discussed above, VCMA-STT switching is the first switching mechanisms described herein. The second switching mechanism is VCMA-precessing switching. Irrespective of whether the initial state of the magnetization vector is pointing in the +z or the −z direction, when a sufficient positive voltage is applied to lower the interface anisotropy (thereby lowering EB), the magnetization would start precessing around the in-plane axis. A schematic of this phenomenon is shown in FIG. 6A. That is, by applying the appropriate voltage for the appropriate amount of time (i.e., a voltage pulse), the magnetization vector would complete a half-cycle around the hard-axis (i.e., in-plane axis): if it initially started from +z direction, it would now be pointing closer to the −z direction, and if it initially started from −z direction, it would now be pointing closer to the +z direction. Therefore, irrespective of the initial state of the MTJ, the magnetization direction would always be reversed if the input voltage pulse is clocked such that the magnetization has only completed a half-cycle around the hard axis (i.e., the voltage pulse is terminated after a 180 degree rotation). With this approach, no STT-type current is in principle needed to make the switch from parallel to anti-parallel and vice versa. Simply by applying the correct voltage polarity pulse for the appropriate amount of time, results in switching of the MTJ. The VCMA-precessional switching is therefore contrasted with VCMA-STT switching by pointing out that no switching current is needed, which can result in significant efficiency and power savings.

The aforementioned VCMA-precessional switching can be used for performing in-situ logic operations. For example, the NOT operation, can take advantage of the VCMA-precessional switching of the MTJs. By establishing the needed voltage pulse (i.e., amplitude and duration) needed to lower the interface anisotropy, an MTJ can be switched. The magnetization vector can start from +z-axis (or −z-axis) and makes approximately a half-cycle around the x-axis before it dampens and consequently settles down in the −z direction (+z direction). Therefore, irrespective of its initial direction, the magnetization vector is always reversed when it completes a half-cycle around the hard axis. This reversal can advantageously be used to establish an in-situ NOT operation.

Figures 6B, 6C:
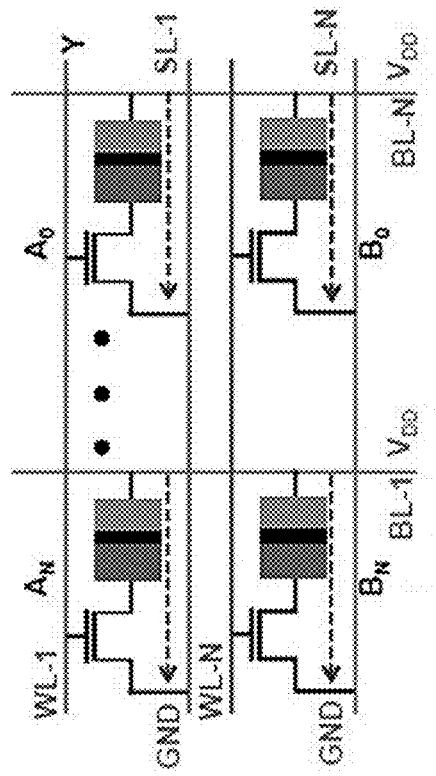
FIGS. 6B and 6C are a table (6B) and a schematic (6C), in which a unipolar switching characteristic of the VCMA-precessional switching according to FIG. 6A causes the magnetization to switch by 180° as a result of application of an appropriate voltage pulse which can be used to construct a massively parallel vector NOT operation (as shown in FIG. 6C).

This unipolar switching characteristic of the VCMA-precessional switch, wherein the magnetization always switches by 180° as a result of application of appropriate voltage pulse, can be used to construct a massively parallel vector NOT operation as shown in FIGS. 6B and 6C. Suppose, a NOT operation for all the bits corresponding to rows WL-1 and WL-N is needed. Both WL-1 and WL-N would be pulled high to activate the access transistors. With proper VDD voltage applied to BL-1 through BL-N, a massive NOT operation can be achieved. The voltage level for VDD would be dictated by the VCMA MTJ characteristics such that the magnetization starts precessing around the hard-axis. Usually, the voltage required for VCMA based precessional switching is higher than the voltage requirement for VCMA-STT dominated switching. After a predetermined time duration, corresponding to the half cycle precession of the magnetization, the WL and VDD voltages would be pulled low, thereby reversing the state of all the MTJs coupled to both WL-1 and WL-N. Using the precessional switching approach, all the WLs in the memory array shown in FIG. 6C can be activated simultaneously such that the entire memory array can be flipped as a large parallel network of cells. As such, all or multiple rows can be flipped in one cycle. It should be appreciated that by proper circuit arrangements, write error rate (WER) can be reduced to $10^{-14}$ for precessional switching in VCMA MTJs.

Figure 7:
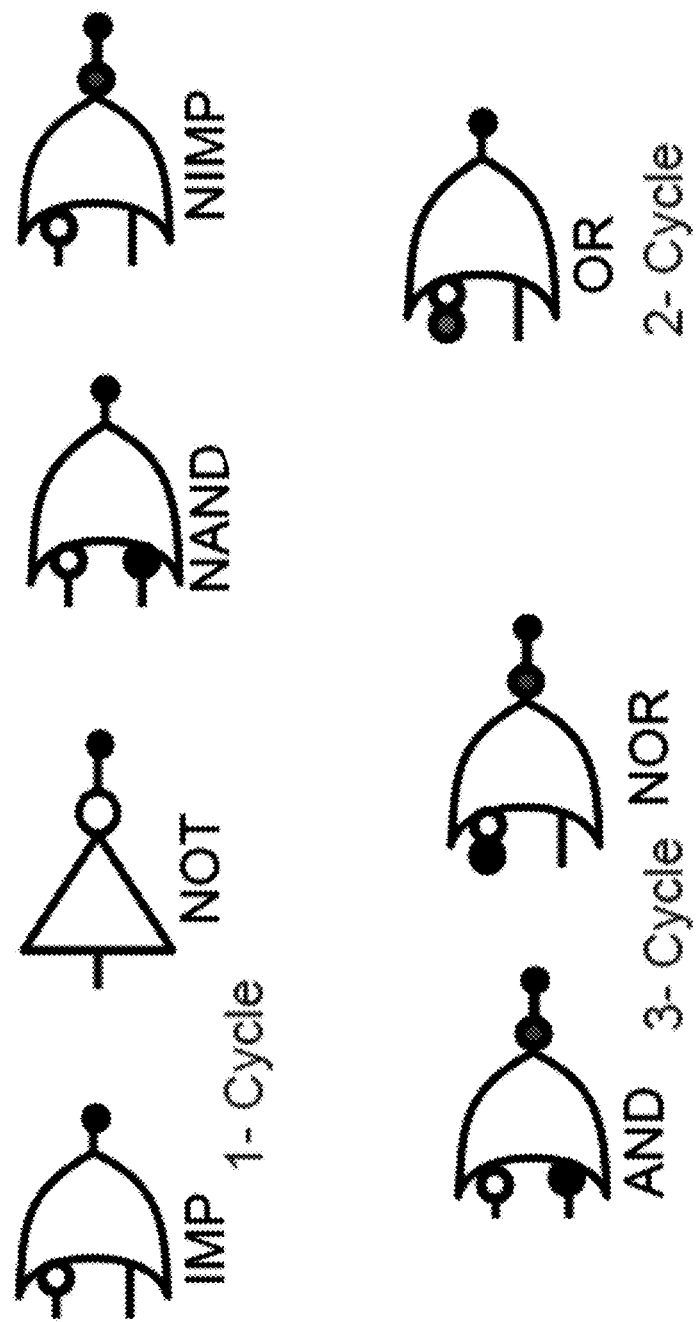
FIG. 7 provides schematics of various 1-cycle, 2-cycle, and 3-cycle logic gates using an IMP operation as well as a NOT operation.

Using the aforementioned information with respect to the IMP operation as well as the NOT operation, since these operations are elemental in achieving other Boolean logic operations, the VCMA-STT voltage asymmetry-based switching and the VCMA-precessional-based switching schemes discussed herein can be used for mapping any arbitrary Boolean computations. For example, as shown in FIG. 7, 1-cycle, 2-cycle, and 3-cycle logic gates are shown. Further, if we assume three cycles, stateful AND/NOR operations can be computed using the proposed techniques. This approach advantageously provides large scale operation without the need to read intermediate results as is the case with other in-memory compute technologies, e.g., read sensing based in-memory memristive computations. It should be noted that the 1-transistor VCMA MTJ array can still be used as a conventional memory block. Therefore, the approach discussed herein present operations by in-situ logic computations thereby allowing one to overcome the von-Neumann bottleneck, discussed in the background section of the present disclosure, resulting in higher throughput and energy-efficiency.

It should be also noted that the implication logic can be substituted with (NOT A) OR (B) as shown in Table 4, below.

TABLE 4

| \multicolumn{4}{c}{Equivalent of Implication logic} |
| A | Not A | B | (NOT A) OR (B) = A(IMP)B |
|---|---|---|---|
| 0 | 1 | 0 | 1 |
| 0 | 1 | 1 | 1 |
| 1 | 0 | 0 | 0 |
| 1 | 0 | 1 | 1 |

While other Boolean logic operations have been described and shown in FIG. 7, the XOR gate is of particular interest. Using the same precessional switching dynamics of the VCMA mechanism described herein, one can implement a stateful XOR operation. Unlike the IMP and NOT operation discussed above, the XOR operation requires a two-step process of read-first and then the XOR operation. In particular, the XOR operation requires representation of one of the operands as an electrical input (i.e. one of the operands is represented by the voltage on a source-line (BL)). This implies to compute the XOR of two vector operands stored in two different rows of the memory array, one of the rows will have to be read first, then converted into an electrical input (a voltage in this case) and applied to the BL line before the XOR operation can be completed. This results in a requirement of read-before-compute as contrasted with the IMP and NOT operations, in which the current values of the operand(s) is of no concern. Even with this limitation, the XOR operation can exploit the precessional switching dynamics and therefore, can enable massively parallel XOR operations similar to the NOT operation, discussed above with relationship to FIGS. 6B and 6C.

Figures 8A, 8B:
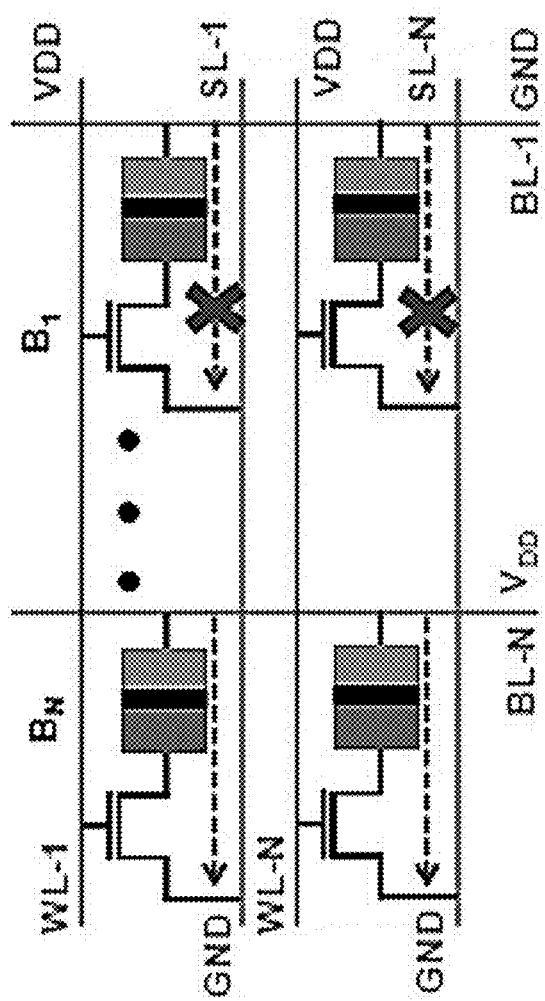
FIGS. 8A and 8B are a table (8A) and a schematic (8B), in which a precessional switching dynamics of the VCMA mechanism can be used to perform a bit-wise, stateful, parallel XOR operation (FIG. 8B).

In order to describe the functionality of the stateful XOR operation, the truth table of an XOR gate is first provided, as shown in FIG. 8A. The operand B retains its original value when the operand A is L (as provided in rows 1 and 2), whereas when the operand A is H the state of the operand B is inverted (as provided in rows 3 and 4). As such, the XOR operation can be seen as conditional NOT operation, wherein the operand B is inverted only when the operand A is H.

As discussed above, the precessional switching dynamics of the VCMA mechanism can be used to perform the NOT operation. Based on such precessional mechanism the proposed bit-wise, stateful, parallel XOR operation can be performed as shown in FIG. 8B. The operand A is represented as the voltages on lines BL (BL-1 . . . BL-N). An example where the $N^{th}$ bit of the vector operand A ($A_N$) is H and A1 is L is shown in FIG. 8B. In this example, BL-N would be pulled up to VDD and BL-1 would remain at 0 volts. The row WL-1 that is supposed to store the vector operand B would then be activated by pulling WL-1 to a high voltage. By ensuring the WL-1 is ON only for a time duration such that the pulse width corresponds to the half-cycle of the magnetization vector, the bits of operand B can be conditionally inverted based on whether the corresponding bit of operand A was H or L, thereby completing the XOR operation.

The approach discussed herein for stateful XOR operation advantageously requires a non-zero voltage to be applied to the BL only if the corresponding bit of the operand A is H. As such, for those cases where the corresponding bit of the operand A is L, the bit-cells consume no energy as both the SL and the BL for those bits are at zero volts. Statistically, this would reduce the energy consumption by about 50%. Given the extensive use of the XOR operation in many compute applications and the fact that implementing XOR using CMOS transistors is expensive in terms of both energy and area, the in-situ stateful XOR of the present disclosure provides a low energy and low area XOR for in-memory computations. Another benefit of the proposed XOR operation is the possibility of doing a massively parallel operation similar to the NOT operation. Suppose, the operand A is an encryption key that has to be XORed with all the data stored in multiple rows of the memory array. In principle, all the WLs can be simultaneously activated, such that all the bits in the corresponding rows flip conditionally based on the voltages at respective SLs, thereby completing the XOR operation for multiple rows in a single cycle. The energy consumption for the proposed XOR operation per bit is same as the NOT operation except that in about 50% of cases when the bits of operand A are zeros, no energy would be consumed.

Figures 9A, 9B:
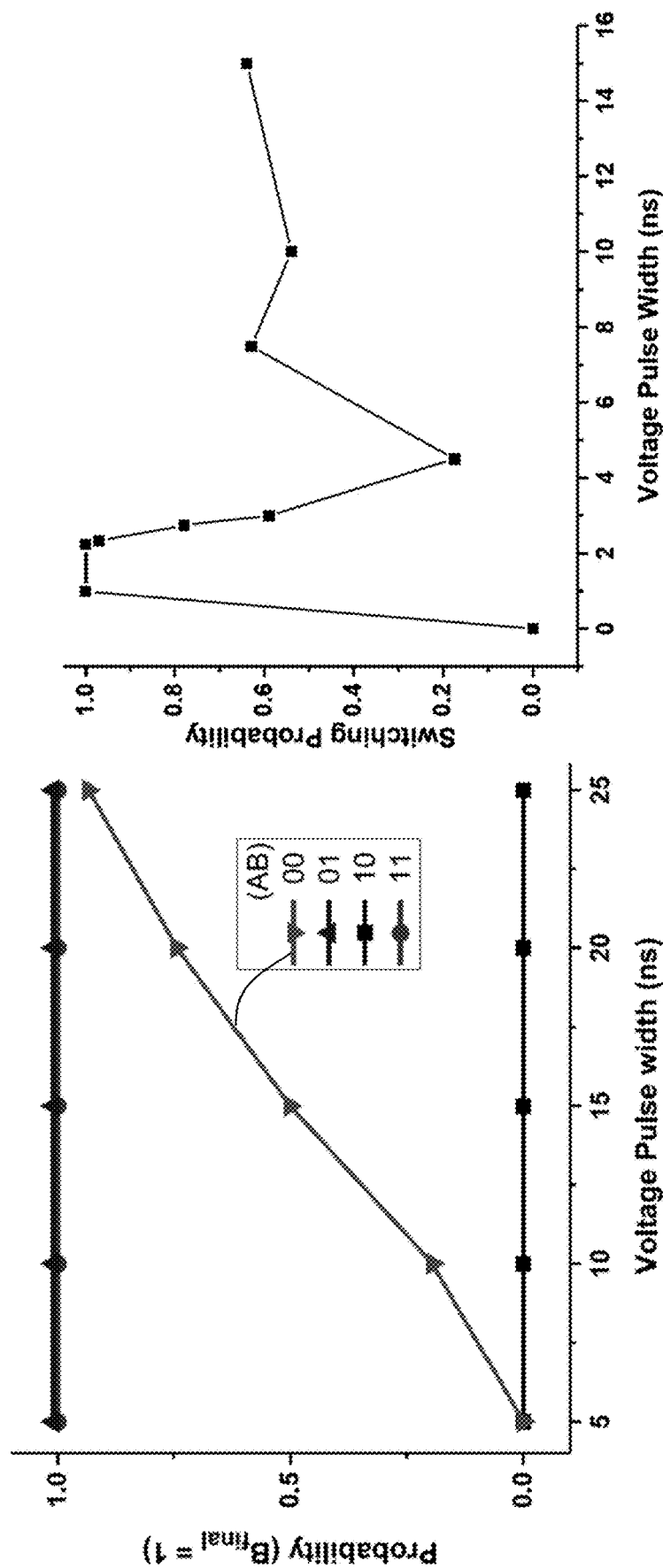
FIG. 9A is a graph of probability vs. voltage pulse width (ns) in performing a VCMA-STT-based IMP operation.
FIG. 9B is a graph of the switching probability as a function of voltage pulse width (ns), in presence of thermal variations while performing a VCMA-precessional NOT operation.

Results of the IMP and NOT operations are now provided. First, an example of the IMP operation is provided. In performing an IMP operation on vectors A and B, the current flows from the bit-cells storing bits corresponding to operand A to bit-cells corresponding to operand B, eventually replacing vector B with the resulting bit-wise IMP operation (see FIG. 4). Referring to FIG. 9A, a graph of probability vs. voltage pulse width (ns) is shown. The probability of B's final state—which represents the result—being '1' (or 'H' or AP) for the four possible A and B inputs '00', '01', '10' and '11', is shown as a function of the applied voltage pulse width. The results are provided for various runs in presence of stochastic thermal variations. It can be observed that when the initial state of B is 'H' or AP (for inputs '01' and '11'), the final state is also AP, irrespective of A's state. This is because the direction of the current flow restricts B from switching from AP to P state. On the other hand, for the input '11', B never switches its state since the current flowing through the bit-cells in this case is designed to be lower than the critical current required for STT switching, given the fact that the voltage across MTJ-2 is not high enough to sufficiently lower its EB. However, for the input '00', B switches with a probability of about 1, for a voltage pulse width of ~25 ns, thus verifying the functionality and robustness of the bit-wise IMP operation.

While IMP uses VCMA-STT-based switching, the NOT operation is primarily based on VCMA-precessional switching. As described above, the magnetization starts precessing along the hard-axis, once a sufficient voltage is applied across the MTJ (see FIG. 6A). Note that the VDD for the NOT operation is specially chosen, so as to ensure VCMA-precessional dynamics. FIG. 9B is a graph of the switching probability as a function of voltage pulse width, in presence of thermal variations. The switching probability shows an oscillatory behavior since the final state of the MTJ depends on the magnetization vector direction at the instant when the voltage is turned off. Such oscillating switching probability is typical for precessionally switched magnets. When the magnetization makes a half-cycle of precession (~2 ns) around the hard-axis, a switching probability close to 1 is achieved, thus confirming the expected functionality for the NOT operation. The presented figure is for the P to the AP switching, similar oscillating probability is also obtained for the AP to P switching. It should be appreciated that the NOT operation can be massively parallel. Even multiple vectors can be inverted simultaneously, by activating the corresponding WLs and SLs of the bit-cells. The average energy consumption per-bit and latency of the IMP operation is tabulated in Table 5, provided below.

TABLE 5

Average energy consumption per-bit and latency in the OR and NOT vector operations

| Vector Operation Average Energy | Latency | VDD |
|---|---|---|
| IMP 1.22 pJ | 25 ns | 1.7 V |
| NOT 0.067 pJ | 2 ns | 0.8 V |

Those having ordinary skill in the art will recognize that numerous modifications can be made to the specific implementations described above. The implementations should not be limited to the particular limitations described. Other implementations may be possible.

The invention claimed is:

1. An in-situ in-memory implication gate, comprising:
a memory cell comprising
a first voltage source;
a second voltage source lower in value than the first voltage source;
a first and second magnetic tunneling junction devices (MTJ) selectively juxtaposed in a series and mirror imaged relationship between the first and second sources, each having a first magnetic layer with a fixed a polarity (pinned layer (PL)) in a first direction and a second magnetic layer (free layer (FL)) having a polarity that can be switched from the first direction in which case the MTJ is in a parallel (P) configuration presenting an electrical resistance to current flow below a first resistance threshold to a second direction in which case the MTJ is in an anti-parallel (AP) configuration presenting an electrical resistance to current flow higher than a second resistance threshold, and further each having a non-magnetic layer (NML) separating the PL from the FL,
wherein each of the first and second MTJs presents an energy barrier (EB) to switching from P to AP or AP to P based on voltage across PL and FL ($V_{PLFL}$) such that when $V_{PLFL}$ is less than zero, the corresponding MTJ's EB is higher than a predetermined EB threshold corresponding to $V_{PLFL}$ equal to zero, and when $V_{PLFL}$ is greater than zero, the MTJ's EB is lower than the predetermined EB threshold,
when the first and second MTJs are in the P-P orientations, the second MTJ flips to AP, and when the first and second MTJs are in P-AP, AP-P, AP-AP, the state of MTJs remains unchanged.

2. The in-situ in-memory implication gate of claim 1, wherein the first resistance threshold is between about 10 kohms and about 15 kohms and the second resistance threshold is between about 30 kohms and about 45 kohms.

3. The in-situ in-memory implication gate of claim 1, wherein the predetermined EB threshold is about 60 KT.

4. The in-situ in-memory implication gate of claim 1, wherein the NML is selected from the group consisting essentially of Aluminum oxide and magnesium oxide.

5. The in-situ in-memory implication gate of claim 4, wherein the thickness of the NML is between about 1.3 nm and about 1.5 nm.

6. The in-situ in-memory implication gate of claim 1, wherein the FL is cobalt-iron-boron.

7. The in-situ in-memory implication gate of claim 6, wherein the thickness of the FL is between about 0.7 nm and about 1.2 nm.

8. The in-situ in-memory implication gate of claim 1, wherein the selective coupling of the first and second MTJs is via a first electronic switch coupled in series between the first source and the first MTJ and further via a second electronic switch coupled in series between the second source and the second MTJ.

9. The in-situ in-memory implication gate of claim 8, wherein the memory cell is provided in a network of memory cells where a plurality of the first MTJs and the first electronic switches controlled by a first associated word-line form a first associated row and a plurality of second MTJs and the second electronic switches controlled by a second associated word-line form a second associated row.

10. The in-situ in-memory implication gate of claim 9, whereby selecting the first and second associated word-lines, the network of memory cells can generate a plurality of implication logic elements at once.

11. An in-situ in-memory logic gate, comprising:
a memory cell comprising
a first voltage source;
a second voltage source lower in value than the first voltage source;
a first magnetic tunneling junction device (MTJ) selectively disposed between the first and second sources, the MTJ having a first magnetic layer with a fixed a magnetic polarity (pinned layer (PL)) in a first direction and a second magnetic layer (free layer (FL)) having a magnetic polarity that can be switched from the first direction in which case the MTJ is in a parallel (P) configuration presenting an electrical resistance to current flow below a first resistance threshold to a second direction in which case the MTJ is in an anti-parallel (AP) configuration presenting an electrical resistance to current flow higher than a second resistance threshold, and further the MTJ having a non-magnetic layer (NML) separating the PL from the FL, wherein when a positive voltage across PL and FL ($V_{PLFL}$) is applied for a predetermined duration of time to the MTJ, the magnetic polarity of the FL processes between the first and second directions thereby switching the MTJ between P and AP states, wherein the logic gate is an inverter.

12. The in-situ in-memory logic gate of claim 11, wherein the selective coupling of the MTJ is via an electronic switch coupled in series between the MTJ and the second source.

13. The in-situ in-memory logic gate of claim 12, wherein the memory cell is provided in a network of memory cells where a first plurality of the MTJs are coupled to the first source and each electronic switch associated with each MTJ of the first plurality of MTJs is controlled by a first associated word-line forming a first associated row and a second plurality of MTJs are coupled to the first source and each electronic switch associated with each MTJ of the second plurality of MTJs is controlled by a second associated word-line forming a second associated row.

14. The in-situ in-memory logic gate of claim 13, whereby selecting the first and second associated word-lines, the network of memory cells can generate a plurality of inverter logic gates at once.

15. The in-situ in-memory logic gate of claim 11, further comprising selective switching of the first source to an operand such that when the operand represents a digital high, the corresponding MTJ is an inverter and when the operands represents a digital low, the corresponding MTJ retains value, thereby forming an XOR gate.

16. The in-situ in-memory logic gate of claim 15, wherein the memory cell is provided in a network of memory cells where a first plurality of the MTJs are selectively coupled each to a corresponding operand and each electronic switch associated with each MTJ of the first plurality of MTJs is controlled by a first associated word-line forming a first associated row and a second plurality of MTJs are selectively coupled each to the corresponding operand and each electronic switch associated with each MTJ of the second plurality of MTJs is controlled by a second associated word-line forming a second associated row.

17. The in-situ in-memory logic gate of claim 13, whereby selecting the first and second associated word-lines, the network of memory cells can generate a plurality of XOR logic gates at once.

* * * * *